United States Patent
Shie et al.

(10) Patent No.: US 6,480,389 B1
(45) Date of Patent: Nov. 12, 2002

(54) HEAT DISSIPATION STRUCTURE FOR SOLID-STATE LIGHT EMITTING DEVICE PACKAGE

(75) Inventors: Jin-shown Shie, HsinChu (TW); Chih-yuan Yen, HsinChu (TW); Chien-chen Hung, HsinChu (TW); Mei-hsueh Peng, HsinChu (TW)

(73) Assignee: Opto Tech Corporation (TW)

( * ) Notice: Subject to any disclaimer, the term of this patent is extended or adjusted under 35 U.S.C. 154(b) by 0 days.

(21) Appl. No.: 10/102,131

(22) Filed: Mar. 19, 2002

Related U.S. Application Data
(60) Provisional application No. 60/345,771, filed on Jan. 4, 2002.

(51) Int. Cl.[7] ................................................. H05K 7/20
(52) U.S. Cl. ........................ 361/707; 361/719; 362/218; 362/294; 362/373
(58) Field of Search .................................. 174/16.3, 252; 165/80.2, 80.3, 185; 257/706–707, 712–713; 361/704–710, 717–722, 71; 362/11, 294, 218, 373

(56) References Cited
U.S. PATENT DOCUMENTS

| | | | | |
|---|---|---|---|---|
| 4,729,076 A | * | 3/1988 | Masami et al. | 362/294 |
| 4,935,665 A | * | 6/1990 | Murata | 362/373 |
| 5,119,174 A | * | 6/1992 | Chen | 362/373 |
| 5,857,767 A | * | 1/1999 | Hochstein | 362/373 |

OTHER PUBLICATIONS

US 2001/0030866 Patent Application Publication (Hochstein) Oct. 18, 2001 362/294.*

* cited by examiner

Primary Examiner—Gregory Thompson
(74) Attorney, Agent, or Firm—Martine & Penilla, LLP

(57) ABSTRACT

A light emitting diode (LED) includes a heat dissipation structure characterized by having a heat dissipating fluidic coolant filled in a hermetically sealed housing where at least one LED chip mounted on a metallic substrate is dwelled inside. The heat dissipation structure is configured with a metallic wall erected from the metallic substrate, which is used to hold a transparent cap of the sealed housing in correct position. Furthermore, the erected wall surrounds in proximity with the at least one LED chip, so that the joule heat generated therefrom can be quickly spread out, through the heat dissipating fluidic coolant, to the erected wall, and then diffused along the wall down to the metallic substrate which adjoins with a larger external heat sink for draining the heat, thus preventing the at least one LED from overheating. The other characteristic of the invention resides in that the transparent cap of the sealed housing is made of transparent materials, wherein a convex portion contacted with the heat dissipating fluidic coolant is formed on the inner surface of the transparent cap. Hence if there is any air bubble existing inside the housing due to insufficient filling, it will not dwell in the field of line-of-sight due to buoyancy. The possibility of scattering the LED light due to existing of the bubbles therefore is avoided.

6 Claims, 3 Drawing Sheets

HEAT DISSIPATION STRUCTURE FOR SOLID-STATE LIGHT EMITTING DEVICE PACKAGE

CROSS-REFERENCE TO RELATED APPLICATION

The applicants claim the benefit of the filling date of provisional application No. 60/345,771 filed Jan. 4, 2002, under 35 USC & 119(e)(1).

BACKGROUND OF THE INVENTION

1. Field of the Invention

The present invention relates to an heat dissipation structure for light emitting diodes (LED) and, more particularly, to an LED capable of operating at the condition of high driving current, therefore delivering high intensity of light output for lighting and other applications where strong illumination of light is necessary.

2. Description of the Related Art

The light emitting diode (LED) explains by itself as the lighting device made of semiconductor p-n junction diode. Until recent years, the component has been used only as the indicators or displays of signs in instruments where intensity is not detrimental. The intensity needs only to be strong enough for human eyes to sense at short distance, such as in the applications for power On/Off indication in a TV system and similar ones, or for the digital display of numbers on clock and electronic panels. The power consumption is small and the heat dissipation is not a subject to be concerned.

However, due to the advance of LED technology nowadays, LEDs are much brighter and colorful, spreading from deep blue to beyond the visible spectrum. Hence applications of the present visible LED are greatly extended towards many new frontiers which never were expected before, such as out-door large color displays, traffic lights, automobile light signs, etc. However, even in these applications, clusters of LED lamps still have to be used to gain sufficient intensity. But the cluster structure not only needs a highly labor-intensive assembly, but also results in the packaging very space-concerned, often leading to optical design and thermal management vulnerable.

Therefore, at this moment, a high intensity LED component having a chip or an array of chips built in a compact embodiment capable of delivering high intensity of light has become paramount importance to the related industries.

SUMMARY OF THE INVENTION

It is an object of the present invention to provide a heat dissipation structure for light emitting devices, thereby it is possible that the light emitting devices having the heat dissipation structure are prevented from an increase in temperature, and suitable for an application of high intensity and high current, and reduced in size.

It is another object of the present invention to provide an package for light emitting devices, according to the structure of the package, which is allowable that the light emitted therefrom can be conformed and directed into a desired direction of light beam for specific applications, while the heat generated therefrom is easily dissipated.

According to an aspect of the invention, there is provided the heat dissipation structure for light emitting devices comprising: a metallic substrate having a top surface and a bottom surface, the top surface configured with a cup-shaped portion for the light emitting device being mounted therein and the bottom surface opposite to the top surface including a metallic solder layer deposited thereon, wherein the cup-shaped portion has an upper surface, an inner surface, and an outer surface, an electrically insulating layer deposited on the upper surface and on the outer surface, an electrically conductive electrode layer deposited on the electrically insulating layer and on the inner surface of the cup-shaped portion, and the electrically conductive electrode layer includes two divided electrodes, the one electrode formed on the inner surface of the cup-shaped portion and the other electrode formed on the upper surface and the outer surface thereof; an electrically insulating fluidic coolant filled in the cup-shaped portion; and a light transparent housing hermetically attached to the metallic substrate to seal the electrically insulating fluidic coolant filled in the cup-shaped portion, the light transparent housing having an inner surface configured with a convex portion opposite to the light emitting device.

It is preferred that the metallic substrate is made of a thermally conductive material.

It is preferred that the electrically insulating layer is made of an oxide of the thermally conductive material.

It is advantageous that the heat dissipation structure for light emitting devices further comprises a printed circuit board including the thermally conductive material, wherein the printed circuit board has a surface with at least one electrode formed thereon, and the printed circuit board is electrically connected to the metallic substrate by joining the at least one electrode to the metallic solder layer and joining the at least one electrode to the electrode formed on the upper surface and the outer surface of the cup-shaped portion.

It is preferred that the electrically conductive electrode layer is made of a light-reflective metal.

It is preferred that the light transparent housing has an outer surface configured with a convex portion opposite to the convex portion of the inner surface of the housing.

DETAILED DESCRIPTION OF THE PREFERRED EMBODIMENT

Figure 1:
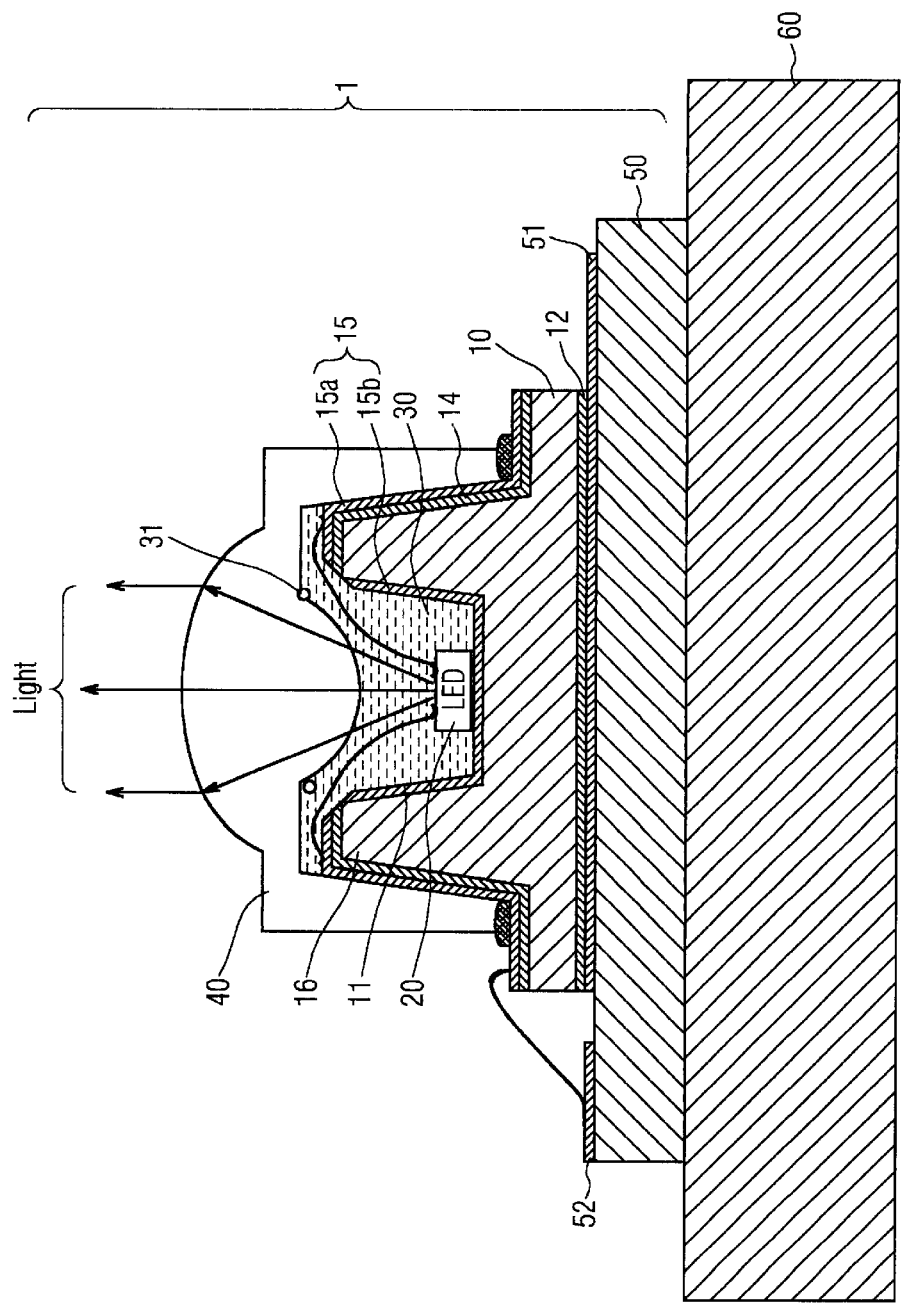
FIG. 1 is a structural diagram showing an LED package having a heat dissipation structure after it has been mounted onto an external substrate according to a preferred embodiment of the present invention.

In the following description of the preferred embodiment, a solid-state light emitting device package 1 having a heat dissipation structure is described by referring to FIG. 1.

The solid-state light emitting device package 1 comprises a metallic substrate 10, at least one LED chip 20, a fluidic coolant 30, a light transparent housing 40 and a printed circuit board (PCB) 50.

The metallic substrate 10 preferably made of a material with excellent thermal conductivity, such as aluminum, copper, etc., is formed to have a wall 16 erected above the metallic substrate 10, and the metallic substrate 10 is therefore configured with a cup-shaped portion 11. Also, the back side of the metallic substrate 10 is electroplated with a layer of metallic solder 12 such as copper, silver or gold for connecting with an electrode 51 of the PCB 50 that is preferably an aluminum-based PCB. For example, the layer of metallic solder 12 can be electrically connected with the electrode 51 by the surface mounting technology (SMT). Further, a layer of aluminum oxide (alumina) 14 functioned as an insulating layer is firstly formed on the upper surface and the outer surface of the wall 16, except on the inner surfaces of the cup-shaped portion 11, and then a layer of electrode material 15, preferably a light reflective metal such as silver, gold or aluminum, is deposited to cover the layer of alumina 14 and, in addition, to cover the inner surfaces of the cup-shaped portion 11.

In specific, the layer of electrode material 15 is formed on the layer of alumina 14 and on all of the inner surfaces of the cup-shaped portion 11. In this state, by means of an adequate processing, a portion of electrode material 15 covered on upper inner peripheral portion of the cup-shaped portion 11 and a portion of alumina 14 covered on the same are removed so as to separate the electrode material 15 into two parts, wherein the one part, referred to as an electrode 15b, on all of the inner surfaces of the cup-shaped portion 11 is substantially connected to the metallic substrate 10, and the other part, referred to as an electrode 15a, on the alumina 14 functioned as the insulating layer between the electrode 15a and the metallic substrate 10 can be used as an independent external electrode of the metallic substrate 10. It is preferable that the adequate processing for removing both of the portion of electrode material 15 and the portion of alumina 14 covered on upper inner peripheral portion of the cup-shaped portion 11 in order to form the electrodes 15a and 15b is a mechanically grinding method.

With the above-mentioned configuration of the metallic substrate 10, the at least one LED chip 20 is mounted onto an area of the electrode 15b, which is located on the inner bottom surface of the cup-shaped portion 11 so that the one side of at least one LED chip 20 is electrically connected with the electrode 15b. Also, the other side of the at least one LED chip 20 is electrically connected onto at least one area of the electrode 15a, which is located on the top surface of the wall 16. In this state, the fluidic coolant 30, preferably, the electrically insulating fluid such as pure water, liquid silicone, etc., surrounded by the wall 16 is filled into the cup-shaped portion 11 to a pre-determined level, and then the light transparent housing 40, whose inner surface is tightly matched with the outer surface of the wall 16 is fixed onto the cup-shaped portion 11 by adhering the end portion of the light transparent housing 40 to the corresponding portion of the metallic substrate 10. In order to prevent residual bubbles 31 resulted from an insufficient filling from dwelling in a space of the cup-shaped portion 11, through which the light emitted from the LED chip 20 passes, the inner surface of the light transparent housing 40, which is contacted with the fluidic coolant 30, is designed to be a curved one, preferably, to be a nipple-shaped surface, so that, by the effect of buoyancy, the residual bubbles 31 do not exist in the space passed by the light emitted from the LED chip 20.

By appropriately electrically connecting the electrodes 15a with another electrode 52 of the PCB 50, the solid-state light emitting device package 1 with the provided structure of the preferred embodiment can be mounted on an external substrate 60, which is inherently functioned as a larger external heat sink. Therefore, according to the structure of the present invention, it is possible that the joule heat generated from the at least one lightened LED chip 20 is quickly spread out, through the heat dissipating fluidic coolant 30, to the erected wall 16, and then downwardly diffused along the wall 16 to the metallic substrate 10 which adjoins with the external substrate 60 for draining the heat, thereby it can prevent the lightened LED chip 20 from an increase in temperature.

Further, it is possible to select the refractive indices of the heat dissipating fluidic coolant 30 and the light transparent housing 40 to allow the difference between them to be minimal, so that the refractive effect between the two materials is minimized. In addition, the outer surface of the transparent cap can be optionally molded into a designated optical shape so that the light from the at least one LED can be conformed and directed into a desired beam shape for specific applications.

Figure 2:
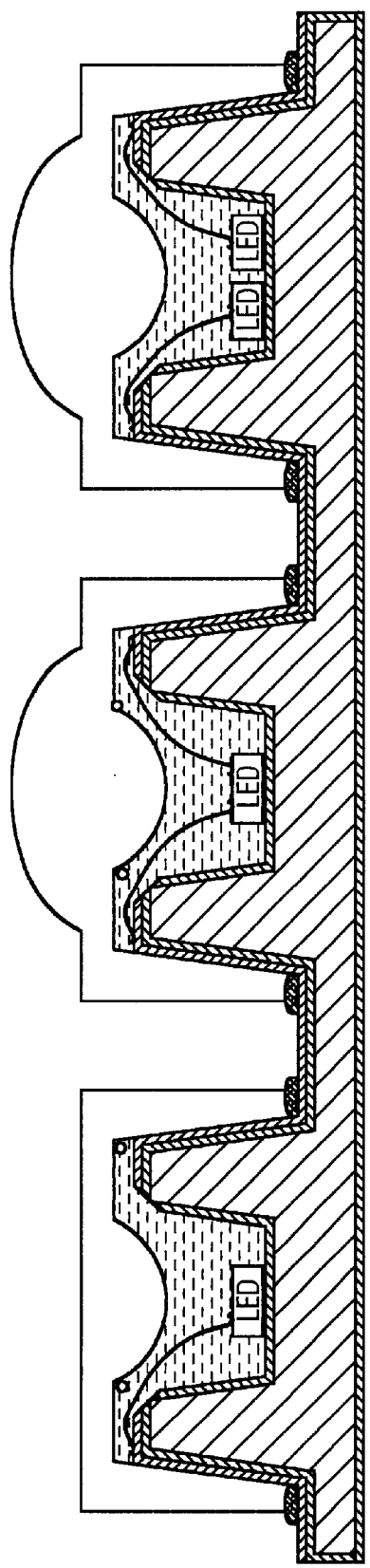
FIG. 2 is a structural diagram showing a modification of the preferred embodiment of the present invention.

While the preferred embodiment of the present invention has been described, the preferred embodiment permits various modifications similar to the same, such as an array of the solid-state light emitting device packages 1 (FIG. 2), filling with an arbitrary electrically insulating fluidic coolant 30, etc.

Figure 3:
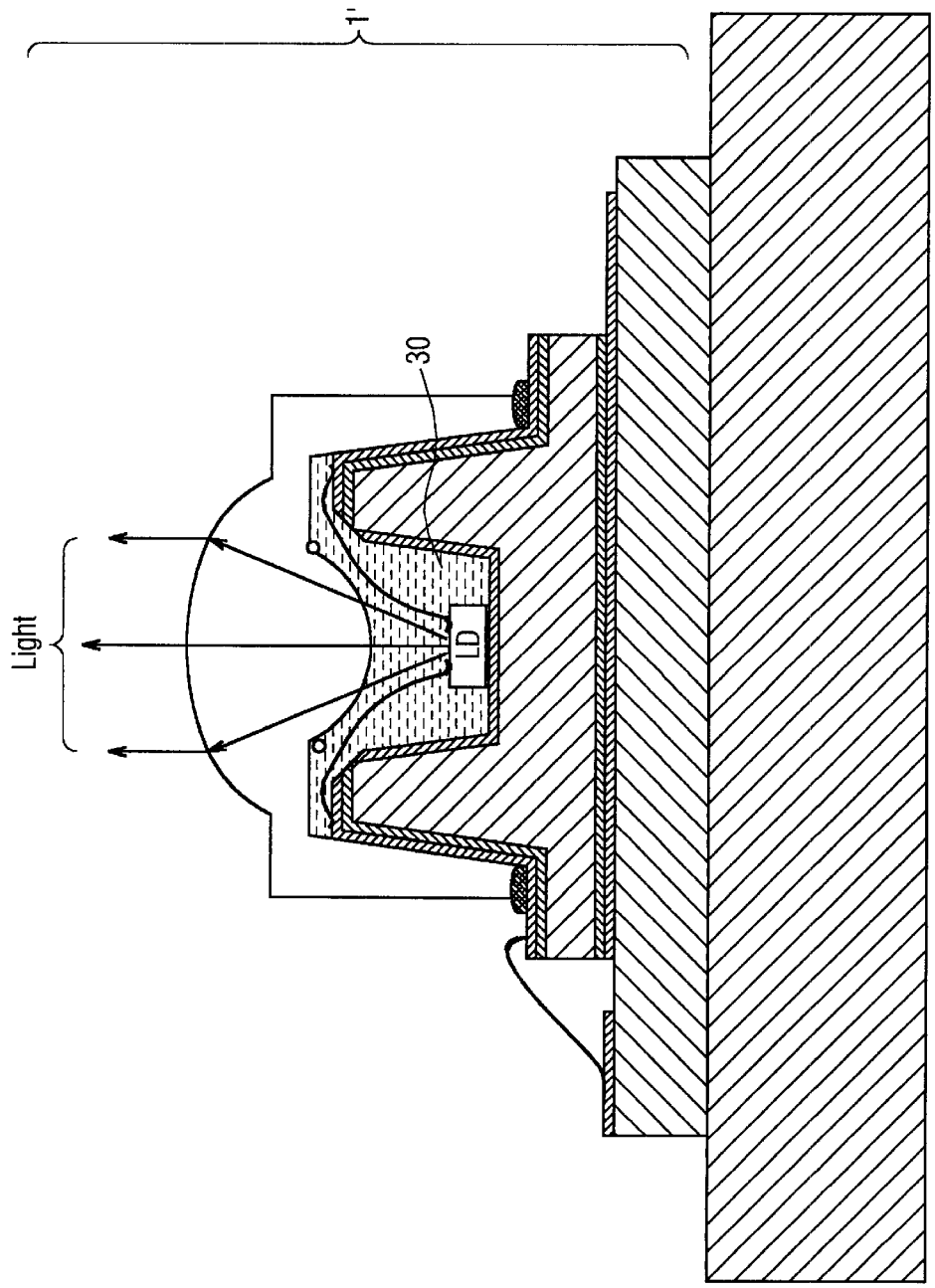
FIG. 3 is a structural diagram-showing another modification of the preferred embodiment of the present invention.

While the preferred embodiment of the present invention has been described, the preferred embodiment permits modification to a laser diode (LD) package 1' (FIG. 3), filling with an arbitrary electrically insulating fluidic coolant 30. The effect of the package 1' is even more prominent for LDs which are highly temperature-sensitive devices, both high power LD and low power ones, in comparison with LEDs. Cooling a laser diode in operation with the technology of this invention can enhance its optical power deliverability, reliability, and more important, the wavelength stability in some occasions.

While the preferred embodiment of the present invention has been described, the preferred embodiment permits modification to an organic light emitting diode (OLED) package, filling with an arbitrary electrically insulating fluidic coolant 30.

It is apparent that the present invention is not limited to the preferred embodiment but may be changed and modified without departing from the scope and spirit of the invention.

What is claimed is:

1. A heat dissipation structure for a light emitting device comprising:

a metallic substrate having a top surface and a bottom surface, the top surface configured with a cup-shaped portion for the light emitting device being mounted therein and the bottom surface opposite to the top surface including a metallic solder layer deposited thereon, wherein the cup-shaped portion has an upper surface, an inner surface, and an outer surface, an electrically insulating layer deposited on the upper surface and on the outer surface, an electrically conductive electrode layer deposited on the electrically insulating layer and on the inner surface of the cup-shaped portion, and the electrically conductive electrode layer includes two divided electrodes, the one electrode formed on the inner surface of the cup-shaped portion and the other electrode formed on the upper surface and the outer surface thereof;

an electrically insulating fluidic coolant filled in the cup-shaped portion; and a light transparent housing hermetically attached to the metallic substrate to seal the electrically insulating fluidic coolant filled in the cup-shaped portion, the light transparent housing having an inner surface configured with a convex portion opposite to the light emitting device.

2. The heat dissipation structure as recited in claim 1, wherein the metallic substrate is made of a thermally conductive material.

3. The heat dissipation structure as recited in claim 2, wherein the electrically insulating layer is made of an oxide of the thermally conductive material.

4. The heat dissipation structure as recited in claim 2, further comprising a printed circuit board including the thermally conductive material, wherein the printed circuit board has a surface with at least one electrode formed thereon, and the printed circuit board is electrically connected to the metallic substrate by joining the at least one electrode to the metallic solder layer and joining the other than at least one electrode to the electrode formed on the upper surface and the outer surface of the cup-shaped portion.

5. The heat dissipation structure as recited in claim 1, wherein the electrically conductive electrode layer is made of a light-reflective metal.

6. The heat dissipation structure as recited in claim 1, wherein the light transparent housing has an outer surface configured with a convex portion opposite to the convex portion of the inner surface of the housing.

* * * * *